United States Patent [19]
Declercq et al.

[11] Patent Number: 5,473,268
[45] Date of Patent: Dec. 5, 1995

[54] INTERMEDIARY CIRCUIT BETWEEN A LOW VOLTAGE LOGIC CIRCUIT AND A HIGH VOLTAGE OUTPUT STAGE IN STANDARD CMOS TECHNOLOGY

[75] Inventors: Michel J. Declercq, Penthaz; Martin F. W. Schubert, Renens, both of Switzerland

[73] Assignee: Ecole Polytechnique Federale De Lausanne, Switzerland

[21] Appl. No.: 182,143

[22] PCT Filed: May 18, 1993

[86] PCT No.: PCT/CH93/00124

§ 371 Date: Jan. 14, 1994

§ 102(e) Date: Jan. 14, 1994

[87] PCT Pub. No.: WO93/23926

PCT Pub. Date: Nov. 25, 1993

[30] Foreign Application Priority Data

May 18, 1992 [FR] France .................. 92 06030

[51] Int. Cl.$^6$ ............... H03K 19/094; H03K 3/26
[52] U.S. Cl. ................ 326/80; 326/68; 326/81
[58] Field of Search ................ 307/475, 451, 307/270, 448, 450; 326/68, 80, 81

[56] References Cited

U.S. PATENT DOCUMENTS

| | | |
|---|---|---|
| 4,164,842 | 8/1979 | Ebihara . |
| 4,365,172 | 12/1982 | Prater ............................ 307/475 |
| 4,617,477 | 10/1986 | DePaolis, Jr. .................. 307/475 |
| 4,763,022 | 8/1988 | Sheldon ......................... 307/475 |
| 4,952,825 | 8/1990 | Yoshida . |
| 4,999,529 | 3/1991 | Morgan, Jr. et al. ............ 307/475 |
| 5,043,605 | 8/1991 | Gabara ........................... 307/475 |
| 5,359,243 | 10/1994 | Norman .......................... 307/475 |

FOREIGN PATENT DOCUMENTS

| | | |
|---|---|---|
| 3733046 | 4/1989 | Germany . |
| 57-011536 | 1/1982 | Japan . |
| 62-245715 | 10/1987 | Japan . |
| 2060300 | 4/1981 | United Kingdom . |
| 86/03632 | 6/1986 | WIPO . |

OTHER PUBLICATIONS

NEC Research & Development; No. 94, Jul. 1989, Tokyo, JP pp. 29–35; M. Nakano et al. 'Full–Complementary High–Voltage Drive ICs for Flat Display Panels' see figures 1C and 3; paragraphs 1 and 2.

*Primary Examiner*—Edward P. Westin
*Assistant Examiner*—Richard Roseen
*Attorney, Agent, or Firm*—Davis, Bujold & Streck

[57] ABSTRACT

The present invention relates to an intermediary circuit between a low voltage logic circuit and a high voltage output stage in standard CMOS technology. The output stage (20) is comprised of two transistors, respectively with N channel and P channel, achieved according to a standard CMOS technology. The intermediary circuit is comprised of a voltage level translator (21) coupled between an input logic circuit SL and said output stage (20). The voltage level translator (21) is achieved according to a standard CMOS technology and is comprised of at lest two similar base blocks forming voltage mirrors interconnected in a cross-configuration. Said circuit is used to control transducers, plasma screens and electromechanical actuators.

9 Claims, 4 Drawing Sheets

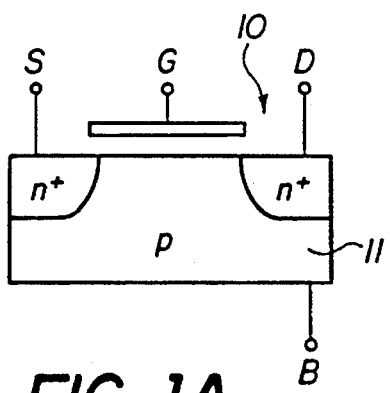
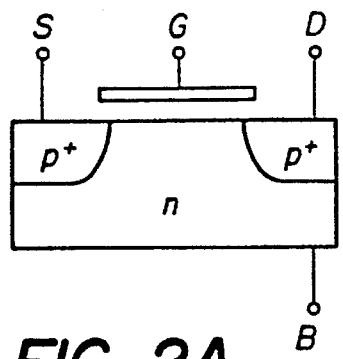
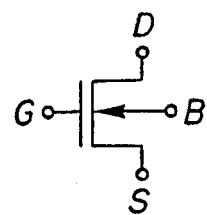
FIG. 1A    FIG. 2A    FIG. 1B
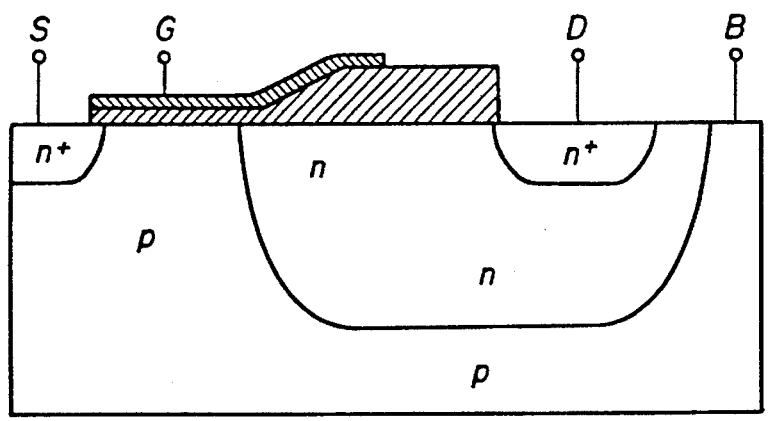
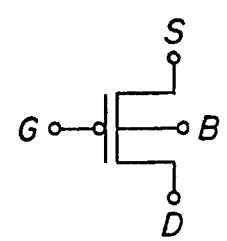
FIG. 3A    FIG. 2B
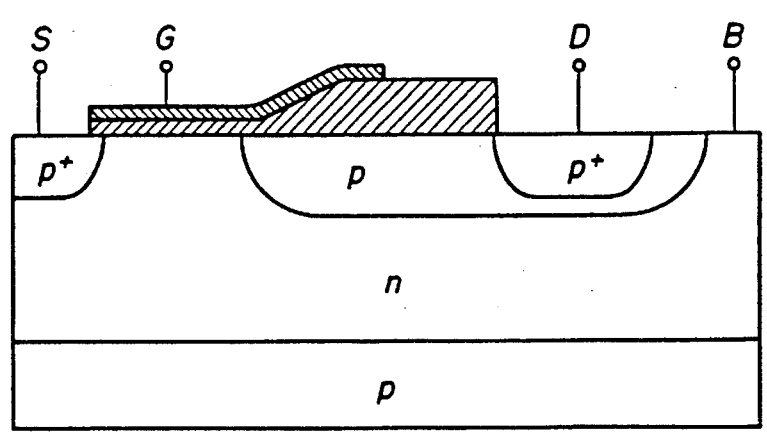
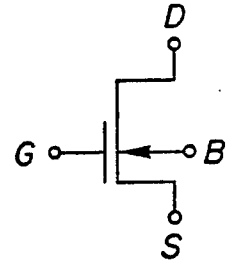
FIG. 4A    FIG. 3B
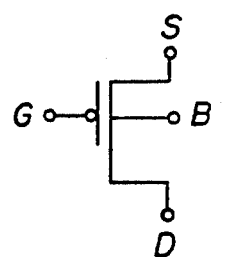
FIG. 4B

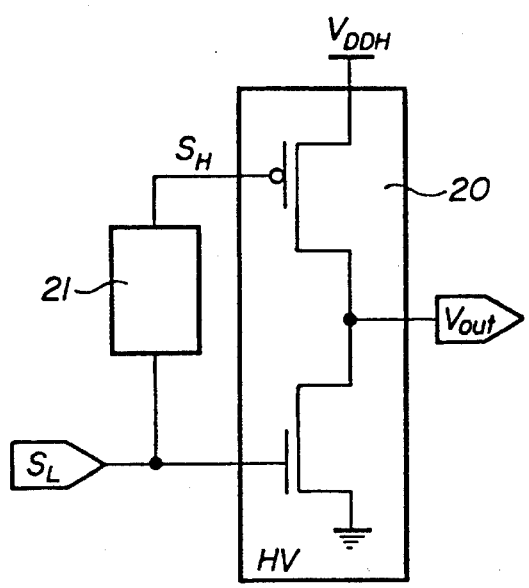
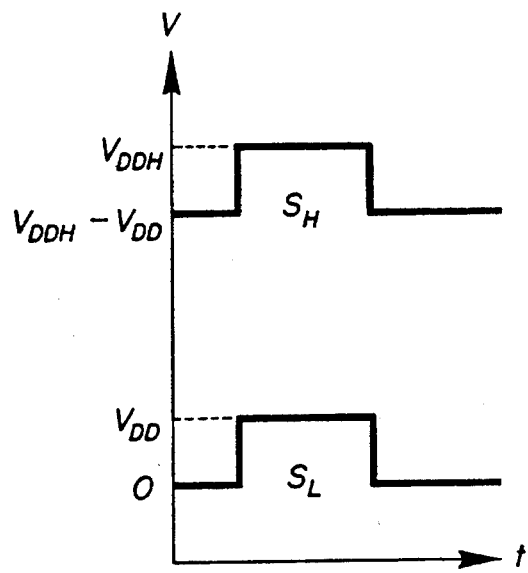
FIG. 5A  FIG. 5B
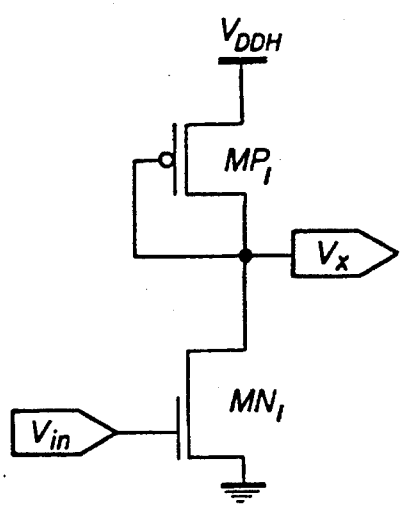
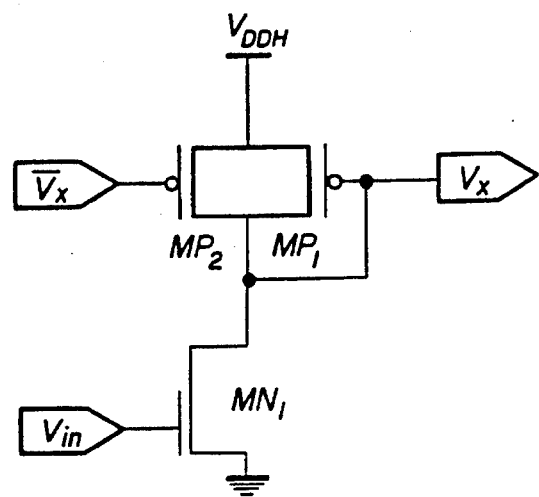
FIG. 6  FIG. 7

INTERMEDIARY CIRCUIT BETWEEN A LOW VOLTAGE LOGIC CIRCUIT AND A HIGH VOLTAGE OUTPUT STAGE IN STANDARD CMOS TECHNOLOGY

The present invention concerns an intermediary circuit between an integrated low voltage logic circuit and a high voltage output stage for controlling transducers, plasma screens and electromechanical actuators, wherein said high voltage output stage comprises at least two transistors with channel N and channel P, respectively, assembled according to standard CMOS technology.

In the context of the present invention, "high voltage" means any voltage which is higher than the "nominal" or "normal" voltage used in a technology, including tolerance. This nominal or normal usage voltage corresponds to the voltage supply normally applied to the standard MOS components and/or circuits assembled in this technology which the latter can withstand without damage during intermittent or continuous use.

Generally speaking, receptors and actuators are designed to establish communication between the circuits which process a signal and their environment. The receptors provide external data to these circuits. The actuators transform low power signals and low voltage signals into external activity, such as, for example, communicating information in a car. During the last few years power circuits with such intelligence known as "smart power electronics" have proven very useful for multiple applications.

In order to combine low voltage logic circuits based on standard complementary metal oxide semiconductor technology manufacturing methods known as "standard CMOS" with high voltage "CMOS" output stages on the same integrated circuit, while also maintaining low production costs, an attempt has been made to produce metal oxide transistors with a field effect, which are called MOSFETs, with high voltage and totally compatible with so-called standard low voltage technology. This has been made possible by a novel combination of layers existing within the standard CMOS technology, which remains unchanged. The creation of slightly doped buffer zones between the channel and the drain and the use of field electrodes and protective screens result in devices capable of withstanding high voltage.

The resulting high voltage MOSFETs have the same threshold voltage $V_T$ as their low voltage counterparts, but are capable of supporting elevated drain-source voltage $V_{ds}$ in excess of 30 V. However, these components are limited to weak gate-source voltage $V_{os}$ because standard gate oxides are thin, thereby causing problems of reliability and efficiency in an intermediary circuit of the type described above designed to be interposed between a low voltage logic circuit and a high voltage output.

The topology of high voltage CMOS reverse-outputs is similar to the conventional reverse CMOS topology in which the source and the mass of the transistor with channel N are connected to a ground $V_{ss}$, the source and the mass of the transistor with channel P are connected to the positive high voltage supply $V_{DDH}$ and the drains of the two transistors are connected together at the output. However, an essential difference is apparent when controlling gates with a low voltage signal issuing from the logic circuit. The gates of the high voltage MOSFET transistor with channel N called an NMOS-HT transistor can be controlled easily by the levels of the low voltage logic $0/V_{DD}$, while the gates of the high voltage MOSFET transistor with channel P called the PMOS-HT transistor requires inserting a level in order to be activated between $V_{DDH}$-$V_{DD}$ and $V_{DDH}$ to respect the relative voltage conditions between the gates and the source $V_{os}$.

One solution for inserting a level could be based on the use of a condenser mounted between the gates of the NMOS transistor and that of the high voltage PMOS transistor. However, this solution has not proven reliable. In practice it is difficult to maintain the gates-source voltage $V_{os}$ within acceptable tolerances during the transitional phases involving engagement of voltage $V_{DDH}$ or during long periods of inactivity.

Various prior publications describe voltage shift circuits, but none of these achieve the result of the present invention or use the method of this invention to achieve this result.

The circuit described in U.S. Pat. No. A-4,952,825 does not use standard low voltage CMOS technology. In particular, the high voltage MOS transistors (HT) of the P-channel type are provided with a thick oxide gate requiring an elevated control voltage, which completely changes the facts of the problem. Furthermore, the output of the translation circuit of FIG. 2A has the role of producing a signal equal in amplitude to the total dynamic of the high voltage supply. This is a good illustration of the amplification of this circuit.

The present invention proposes overcoming these various disadvantages by achieving a circuit of the type described above for controlling a high voltage CMOS reverse output stage with a low voltage logic circuit using an original, reliable and cost-effective method based on well-known, perfected technology. In addition, this circuit is capable of automatically adapting to a wide range of voltages $V_{DDH}$.

To achieve this goal, the circuit according to the invention is characterized by comprising a voltage level translator or shifting means coupled between said low voltage logic circuit input and said high voltage output stage, with said voltage level translator also being made according to standard CMOS technology and consisting of at least two identical base blocks forming voltage mirrors interconnected in cross-configuration.

According to a first embodiment, said voltage mirror comprises at least a first low voltage transistor with a channel P and a second NMOS-T transistor, with the drain of the first transistor being connected to the drain of the second transistor and to the gate of the first and furnishing the output voltage; in addition, the low level input voltage is connected to the gate of the second transistor and the high voltage supply is connected to the source of the first transistor.

In an improved version, said voltage mirror comprises at least a first low-voltage transistor with channel P and a second NMOS-T transistor, with the drain of the first transistor being connected to the drain of the second transistor and to the gate of the first, and supplying the output voltage; the low level input voltage is connected to the gate of the second transistor and the high voltage supply is connected to the source of the first transistor as well as to a third transistor with channel P connected in parallel to said first transistor with channel P; the high level input voltage is connected to the gate of said third transistor and the source of the second transistor is connected to the ground.

According to a first particularly advantageous embodiment of the circuit, the voltage mirror comprises at least a first transistor with channel P and a second high voltage MOSFET transistor with channel N, of the HV-NMOST type, with the drain of the first transistor being connected to the drain of the second transistor and to the gate of the first transistor and delivering the output voltage, while the gate of the second transistor is connected to the voltage supply, with the substrata connected to the ground and the source being connected to the drain of a third NMOS type transistor and a low level input voltage is applied to the gate of this third transistor, the source and the substrata of which are connected to the ground, with the high voltage supply being applied to the source of the first transistor and a second transistor with channel P being connected in parallel to the first transistor, the high voltage level input voltage being applied to the gate of said second transistor.

According to a second particularly advantageous embodiment of the circuit, the voltage mirror comprises at least a first transistor with channel P and a second high voltage MOSFET transistor with channel N, of the HV-NMOS type, with the drain of said first transistor being connected to the drain of the second transistor and to the gate of the first transistor and furnishing an output voltage. The gate of the second transistor provides the voltage supply, while the substrate is connected to the ground and the source is connected to the drain of a supplementary transistor whose source and substrata are connected to the ground; the high level voltage supply is applied to the source of the first transistor, a second transistor with channel P is mounted in parallel to the first transistor, the gate of said second transistor with channel P being supplied with a high level input voltage, and any one of the circuit elements is connected in parallel to the supplementary transistor with channel N. The resistance of this element of the circuit is high enough that the transistors with channel N can function essentially undisturbed.

According to a third particularly advantageous embodiment of the circuit, the voltage mirror comprises at least a first MOSFET transistor with channel P and a second high voltage MOSFET transistor with channel N, of the HV-NMOS type, with the drain of the first transistor being connected to the drain of said second transistor and to the gate of the first transistor and furnishing a voltage output; a low level input voltage is applied to the gate of the second transistor, the high voltage supply being applied to the source of the first transistor and a third transistor with channel P being connected in parallel to the first transistor with channel P, with the gate of said third transistor being supplied with a high level input voltage, and any one of the circuit elements which has sufficiently low resistance to allow the second transistor to function essentially undisturbed is connected between the source of the second transistor and the ground.

In all of the previously described embodiments, the circuit may include an auxiliary protective circuit which is designed to protect at least one of the voltage mirrors from a surge of excessive voltage, said circuit comprising either a chain of diodes connected in series or a Zener diode and, in the case of a chain of diodes, the anode (P type) of the first diode is supplied by the high level input voltage and the cathode (N type) of the last diode is connected to the output of the corresponding voltage mirror and, if a Zener diode is used, the cathode (N type) of the latter is supplied by the input voltage and the anode (P type) is connected to the corresponding voltage mirror.

The voltage level translator may further comprise a logic unit designed to prevent the transistors from being simultaneously conductive at the output stage.

The present invention will be better understood with reference to the description of some exemplary embodiments and to the attached drawing, in which:

FIGS. 1A, 2A, 3A and 4A show cross-sections of various MOSFET and high voltage MOSFET transistors made in accordance with CMOS technology;

FIGS. 1B, 2B, 3B and 4B show the symbols used to represent the transistors shown in cross-section in the preceding drawings;

FIG. 5A is a schematic illustration of the principle of the invention;

FIG. 5B is a graph showing voltage as a function of time elapsed during the functioning of the circuit shown in FIG. 5A;

FIG. 6 shows a first embodiment of the voltage mirror;

FIG. 7 shows a perfected variation of the voltage mirror used in the present invention;

Figure 11:
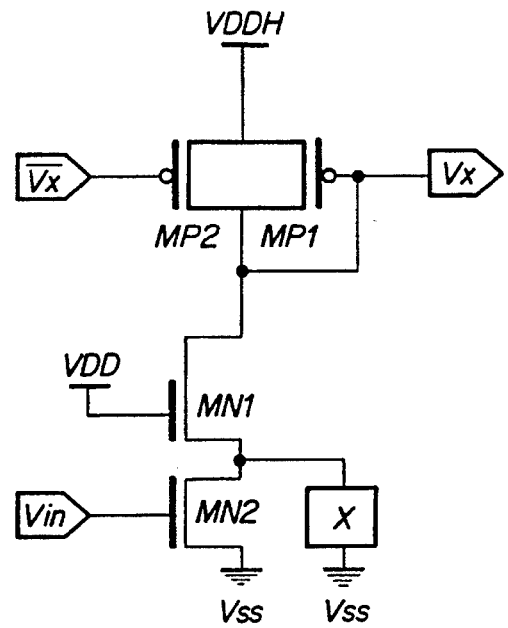
Figure 12:
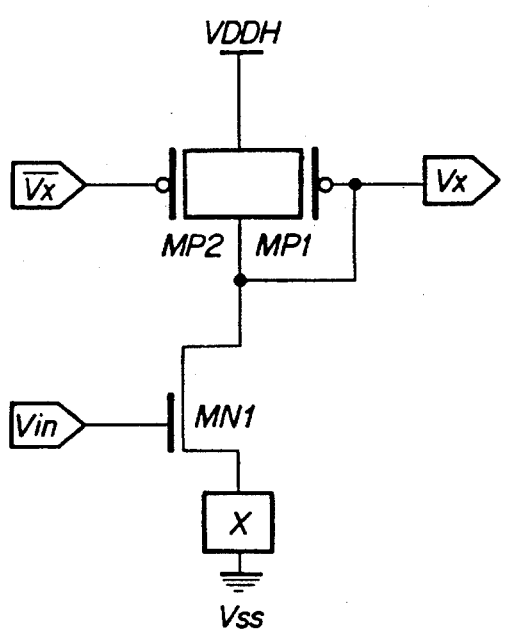
Figure 13:
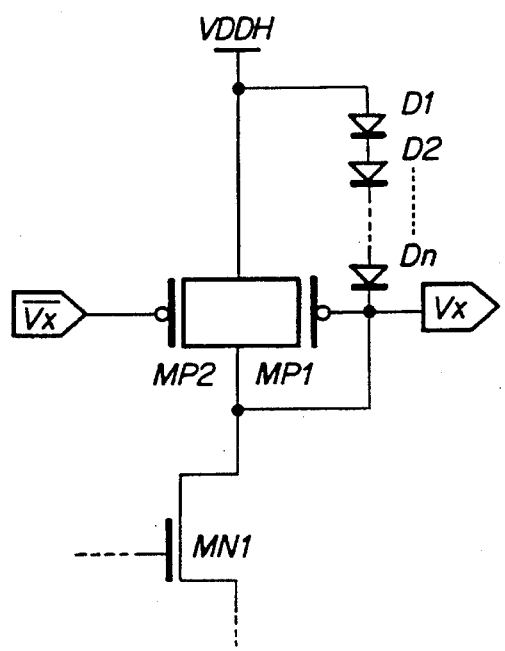

FIGS. 11 and 12 represent variations of the voltage mirrors previously described, comprising complementary circuit elements (X) which do not substantially alter the performance of the circuit unit; and FIG. 13 shows a protective circuit constructed by using a chain of diodes connected in series, which can be used in combination with all the voltage mirrors described above, said circuit being designed to prevent surges of output voltage.

With reference to FIGS. 1A and 1B, the N-MOSFET type transistor 10 comprises a P-type substrate 11 and two doped zones $N^+$ corresponding to source S and drain D, respectively. Gate G is located above the channel connecting the two doped zones $N^+$.

The P-MOSFET type transistor shown in FIGS. 2A and 2B differs from the preceding one in that substrate P is replaced by a convex portion N and doped areas $N^+$ are replaced by convex portions $P^+$.

The transistor shown in FIGS. 3A and 3B is the high-voltage N-MOSFET type using convex portion N as a buffer zone.

The transistor shown in FIGS. 4A and 4B differs from the preceding one in that it is type P and comprises a type P buffer zone.

FIGS. 5A and 5B shown a high voltage output stage which is associated with a voltage level translator device 21 mounted between a low voltage input $S_L$, with a value generally between 0 and 5 V, and an output designed to control the PMOS-HT transistor, whose value SH reproduces that of the input $S_L$ with a lag ($V_{DDH}-V_{DD}$). Levels $V_{DDH}$ and $V_{DD}$ are generally, but not necessarily, situated between 24 V and 5 V, respectively. In the case where $S_L$ varies from 0 to 5 V, the output SH varies in this example from 19 to 24 V.

With reference to FIG. 6, the voltage mirror, in its most elementary form, comprises two transistors of the type P and N, respectively, that is, MOS transistors MP1 and MN1, respectively. Transistor MN1 is charged by transistor MP1, the gate of which is connected to the drain of that same transistor. The base circuit of the voltage mirror is mounted between a high voltage $V_{DDH}$ and the ground, and controlled by input voltage $V_{in}$. It is designed to furnish to the output a voltage $V_x$ such as $V_{DDH}-V_x$ or equal to $V_{in}$. When they become conductive, transistors MN1 and MP1 function normally at saturation level. Transistor MN1 can, however, enter the non-saturated level with low value voltages $V_{DDH}$.

As a result, when the two transistors are functioning at saturation level, the following equation applies:

$$1 = \frac{\beta n}{2}(V_{GS,n} \cdot V_{T,n})^2 = \frac{\beta p}{2}(|V_{GS,p}| \cdot |V_{T,p}|)^2$$

wherein:

1 is the intensity

βn is a coefficient which depends on the size of the transistor with channel N

βp is a coefficient which depends on the size of the transistor with channel P $V_{os,n}$ is the gate-source voltage for the transistor with channel N $V_{gs,p}$ is the gate-source voltage for the transistor with channel P $V_{t,p}$ is the threshold voltage of the transistor with channel P $V_{t,n}$ is the threshold voltage of the transistor with channel N where $$1 = \frac{\beta n}{2}(V_{in} - V_{T,n})^2 = \frac{\beta p}{2}[(V_{DDH} - V_X) - |V_{T,p}|]^2$$

and from this fact:

$$V_{DDH} - V_X = \sqrt{\frac{\beta n}{\beta p}} \cdot (V_{in} - V_{T,n} + |V_{T,p}|)$$

where $V_{DDH} - V_x = V_{in}$ for $\beta n = \beta p$ and $V_{T,n} = V_{T,p}$ $V_{in}$ being limited to a low voltage input $V_{DD}$, and the PMOS transistor called MP1 being a low voltage component while the NMOS transistor called MN1 bears the most significant portion of the voltage surge and must be of the high voltage type.

When $V_{in}$ is equal to $V_{DD}$, the output voltage $V_x$ is effectively equal to $V_{DDH} - V_{DD}$. Furthermore, when $V_{in} = 0$, the two transistors are blocked and the output voltage increases and attains the value $(V_{DDH} - |V_{t,p}|)$ without, however, attaining voltage $V_{DDH}$.

FIG. 7 shows an improved version of the voltage mirror, wherein the second PMOS transistor, namely the MP2 transistor, is connected in parallel with the first transistor MP1 and may be used to bring the value $V_x$ to the value $V_{DDH}$ when $V_{in}$ is at the level $V_{DD}$ and results in the ideal embodiment of a voltage mirror. The control voltage for switching this supplementary component is the complement of $V_x$, or $\overline{V_x}$. This device constitutes the basis of an ideal device for translating the signal $V_{in}$ and preferably is used in the intermediary voltage level translator circuit described below.

Figure 8:
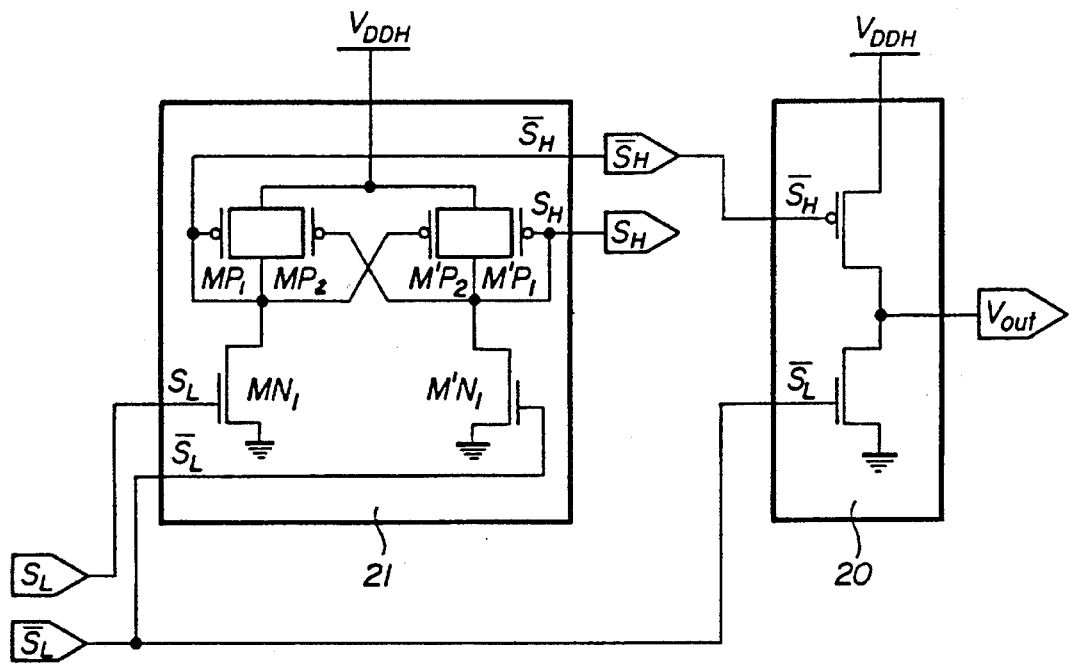
FIG. 8 shows a first embodiment of the voltage level translator which constitutes the core of the intermediary circuit between the low voltage logic and the high voltage output stage according to the invention.

The voltage level translator shown in FIG. 8 comprises two voltage mirrors in cross-configuration to form a high voltage toggle controlled by the complementary low voltage input signals $S_L$ and $\overline{S_L}$. Output signals $S_H$ and $\overline{S_H}$ provide the required translation of $V_{in}$ with a complete shift from $(V_{DDH} - V_{DD})$ to $V_{DDH}$ for $S_L = V_{in}$ between 0 and $V_{DD}$.

This intermediary voltage level translator circuit offers the requisite strength and flexibility for use in numerous applications, specifically, in control circuits for transducers, plasma screens, electromechanical relays, control units and the like.

The concept of this tested translator circuit which guarantees a complete dynamic of amplitude $V_{DD}$ between the values $(V_{DDH} - V_{DD})$ and $V_{DDH}$ is based on the hypothesis that high voltage NMOS transistors MN1 and MN2 on the intermediary circuit work in their saturation zones when they have been switched. From the fact that the maximum voltage surge on the terminals of transistors with channels P is $V_{DD}$, it is verifiable that the saturation condition of the NMOS-HTs is fulfilled for $V_{DDH}$ to $(2V_{DD} - V_t)$.

For values of $V_{DDH}$ below that limit, MN1 and MN2 would be switched out of their saturation zone.

In considering the voltage mirror circuit shown in FIG. 6, the relationships defining continuous intensity are as follows:

$$1 = \beta n \left( (V_{GS,n} \cdot V_{T,n}) V_{DS,n} - \frac{V_{DS,n}^2}{2} \right) = \frac{\beta p}{2}(|V_{GS,p}| - |V_{T,p}|)^2$$

where $$1 = \beta n \left( (V_{in} \cdot V_{T,n}) V_x - \frac{V_x^2}{2} \right) = \frac{\beta p}{2}((V_{DDH} - V_x) - |V_{T,p}|)^2$$

for purposes of simplification, the following hypotheses are used as a starting point:

$\beta_n = \beta_p$ and $V_{t,n} = |V_{t,p}| = V_t$ where $V_{DDH}$ attains a lower limit equal to $V_{DD}$ for $V_{in} = V_{DD}$ the above relationship yields:

$V_x = 0.3 (V_{DD} - V_t)$

For this reason, the maximum amplitude of the voltage variations $V_x$ and $\overline{V_x}$ between their two limits is slightly less than the full voltage $V_{DD}$, but easily sufficient for the MOS P channel transistors of the voltage level translator circuit to become conductive.

The voltage level translator of FIG. 8 will therefore function properly for a very wide range of values $V_{DDH}$ extending from a low voltage input to the maximum voltage allowed by the short-circuit characteristics of the high voltage MOS components.

At the moment the power supply is engaged, the functioning of the circuit is principally determined by the parasitic capacities associated with the active devices.

Simulations have demonstrated that the gate-source capacity $C_{os}$ is dominant and maintains the voltage $V_x$ and $\overline{V_x}$ at nearly $V_{DDH}$, as well as the voltage $V_{os}$ of all the MOS components inside their security domains.

To reduce static in the voltage level translator circuit, it is preferable to use small components. Switching speed, normally not critical in most automated applications, should be in the realm of micro-seconds.

Figure 9:
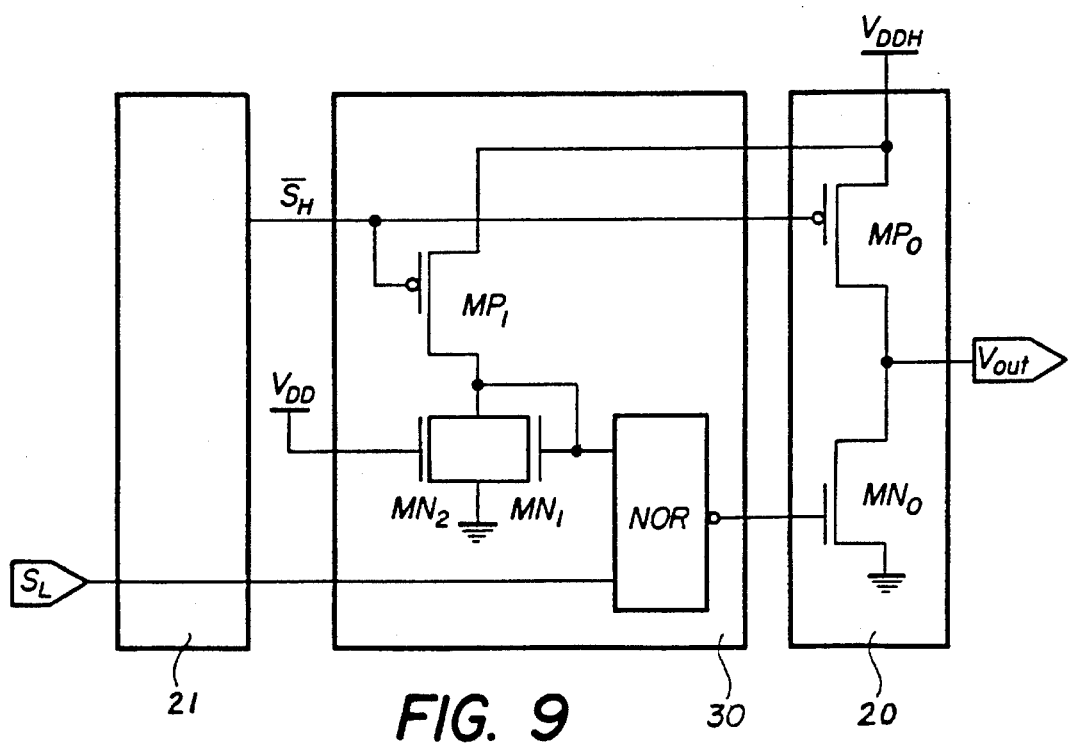
FIG. 9 shows a perfected embodiment of the circuit shown in FIG. 8.

FIG. 9 shows a perfected embodiment of a voltage level translator circuit associated with a logic which significantly reduces power leakage during the switching phase. During the switching phases, the two high voltage NMOS and PMOS transistors of the output stage may be temporarily and simultaneously in a conductive state. This situation is the result of various delays in transmitting control signals $S_L$ and $S_H$. When this condition occurs, a conductive field results between the voltage supply and the ground, causing high intensity shocks in the power output stages. These transitional phases are easily avoided by adjoining a logic circuit preventing superposition, that is, preventing the transistors of the output stage from being simultaneously conductive.

One example of such a logic circuit is illustrated in FIG. 9. Nevertheless, there are various embodiments of such a circuit, which is currently used in class D amplifiers. This supplementary circuit is primarily used for power transistors in applications requiring high power.

Figure 10:
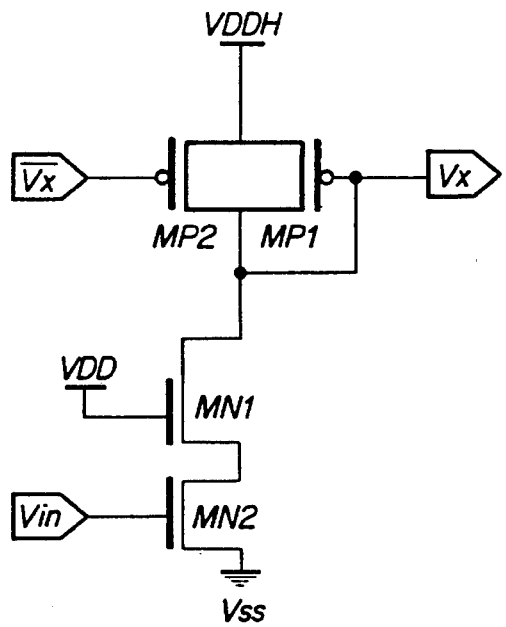
FIG. 10 shows a variation of the perfected voltage mirror, including a supplementary NMOS transistor.

FIG. 10 shows a variation of the improved version of the voltage mirror. In this circuit a second PMOS transistor (MP2) mounted in parallel is associated with the first PMOS transistor (MP1). The supply voltage for switching transistor MP2 is the complement $V_x$ of voltage $V_x$. The drains of MP1 and MP2 are connected to the drain of MN1 and deliver output voltage $V_x$. The gate of MN1 is connected to supply voltage $V_{DD}$ and the substrate is connected to the ground $V_{ss}$. The gate of a second NMOS transistor (MN2) is controlled by input voltage $V_{in}$. The source and the substrate of MN2 are connected to the ground $V_{ss}$ and its drain is connected to the source of MN1.

The circuit also functions when some element of the (additional) circuit X is controlled in parallel to MN2, so long as the resistance of this circuit element is sufficient to prevent it from interfering significantly with the performance of transistors MN1 and MN2.

Similarly, as shown in FIGS. 11 and 12, an element of circuit X may be inserted in the voltage mirror according to FIG. 7, specifically, between the source of MN1 and the ground $V_{ss}$, so lone as the resistance is low enough to prevent it from interfering significantly with the performance of transistors MN1 and MN2.

FIG. 13 shows a protective circuit with diodes which can be associated with each of the voltage mirrors described above. A chain of diodes connected in series is connected between $V_{DDH}$ and output voltage $V_x$. The anode (type P) of the first diode is supplied with voltage $V_{DDH}$ and the cathode (type N) of the last diode is supplied with voltage $V_x$. The number of diodes is such that the sum of their threshold voltage is equal to or greater than $V_{DD}$. During normal functioning a negligible current circulates through the diodes. Conversely, if $V_x$ is significantly larger than the volume of $V_{DDH}$–VDD, then a current of diodes is created, preventing a complementary surge of $V_x$, thereby ensuring protection for the output of the voltage mirror. Protective mechanisms such as these may be of interest or may even be necessary for various control circuits.

In certain situations, the diodes may be replaced by a Zener diode, the cathode of which is supplied with voltage V and the anode with voltage $V_x$.

We claim:

1. An intermediary circuit formed between a relatively low voltage integrated logic circuit and a relatively high voltage output stage with an output for controlling at least one of a transducer, a plasma screen and an electromechanical actuator, said high voltage output stage comprising a CMOS device with a N type channel transistor and a P type channel transistor which are both coupled to said output of said high voltage output stage, wherein said intermediary circuit comprises a CMOS translator device coupled between an output of said low voltage integrated logic circuit and an input of said high voltage output stage, and said translator device comprises at least two identical integrated circuit elements which are interconnected with one another in cross-configuration to form voltage mirrors.

2. An intermediary circuit according to claim 1 wherein said voltage mirrors comprise at least a first low voltage transistor of the P type channel and a second NMOS-HT type transistor; a drain of said first low voltage transistor is connected to a drain of said second NMOS-HT type transistor, to a gate of said first low voltage transistor, and to an output voltage to be supplied; and a relatively low level input voltage is connected to a gate of said second NMOS-HT type transistor; a relatively high level voltage supply is connected to a source of said first low voltage transistor; and a source of said second NMOS-HT type transistor is connected to ground.

3. An intermediary circuit formed between a relatively low voltage integrated logic circuit and a relatively high voltage output stage with an output for controlling at least one of a transducer, a plasma screen and an electromechanical actuator, said high voltage output stage comprising a CMOS device with a N type channel transistor and a P type channel transistor which are both coupled to said output of said high voltage output stage, wherein said intermediary circuit comprises a CMOS translator device coupled between an output of said low voltage integrated logic circuit and an input of said high voltage output stage, said translator device comprises at least two identical integrated circuit elements which are interconnected with one another in cross-configuration to form voltage mirrors, said voltage mirrors comprise at least a first relatively low level transistor of the P type channel and a second NMOS-HT type transistor; a drain of said first relatively low level transistor is connected to a drain of said second NMOS-HT type transistor, to a gate of said first low level transistor and to an output voltage to be supplied; a relatively low level input voltage is connected to a gate of said second NMOS-HT type transistor, and a relatively high level voltage supply is connected to a source of said first relatively low level transistor as well as to a source of a third transistor, of the P type channel, connected in parallel with said first relatively low level transistor; a relatively high level voltage input is connected to a gate of said third transistor; and a source of said second NMOS-HT type transistor is connected to ground.

4. An intermediary circuit according to claim 1 wherein said voltage mirrors comprise at least a first transistor of the P type channel and a second relatively high voltage MOSFET transistor of a N channel, of the HV-NMOST type; a drain of said first transistor is connected to a drain of said second high voltage MOSFET transistor, to a gate of said first transistor, and to an output voltage to be supplied; a gate of said second relatively high voltage MOSFET transistor is connected to a supply voltage; a substrate of said second relatively high voltage MOSFET transistor is connected to ground; a source of said second relatively high voltage MOSFET transistor is connected to a drain of a third NMOS type transistor; and a relatively low level input voltage is supplied to a gate of said third NMOS type transistor; a source and a substrate of said third NMOS type transistor are connected to said ground, a relatively high level voltage input is supplied to a source of said first transistor; a second relatively high voltage MOSFET transistor of the P type channel is connected in parallel to said first transistor; and a relatively high level voltage input is supplied to a gate of said second relatively high voltage MOSFET transistor.

5. An intermediary circuit according to claim 1 wherein said voltage mirrors comprise at least a first transistor of the P type channel and a second relatively high voltage MOSFET transistor of a N channel, of the HV-NMOST type, a drain of said first transistor is connected to a drain of said second high voltage MOSFET transistor, to a gate of said first transistor and to an output voltage to be supplied; a gate of said second relatively high voltage MOSFET transistor is connected to a voltage supply; a substrate of said second relatively high voltage MOSFET transistor is connected to ground and a source of said second relatively high voltage MOSFET transistor is connected to a drain of a supplementary transistor; a source and a substrate of said supplementary transistor are connected to said ground; a relatively high level voltage input is supplied to a source of said first transistor, and a second transistor of the P type channel is connected in parallel to said first transistor, a gate of said second transistor is supplied by a relatively high level voltage input; and an additional circuit is connected in parallel with said supplementary transistor, and said additional circuit has a resistance which is sufficiently high such that operation of said relatively second high voltage MOSFET transistor and of said supplementary transistor is unaffected.

6. An intermediary circuit according to claim 1, wherein said voltage mirrors comprise at least a first MOSFET transistor of a P type channel and a second relatively high voltage MOSFET transistor of a channel N, of the HV-NMOST type, a drain of said first MOSFET transistor is connected to a drain of said second relatively high voltage MOSFET transistor, to a gate of said first MOSFET transistor, and to an output voltage to be supplied; a relatively low level voltage input is supplied to a gate of said second relatively high voltage MOSFET transistor; a relatively high level voltage input is supplied to a source of said first MOSFET transistor; a third transistor of a P type channel is connected in parallel with said first MOSFET transistor; a gate of said third transistor is supplied with a relatively high level voltage input; and an additional circuit, which has a sufficiently low resistance such that operation of said second relatively high voltage MOSFET transistor remains unaffected, is connected between a source of said second relatively high voltage MOSFET transistor and said ground.

7. An intermediary circuit according to claim 1 further comprising an auxiliary protective circuit, said auxiliary protective circuit protects at least one of said at least two identical integrated circuit elements of said voltage mirror from voltage surges, said auxiliary protective circuit includes a chain of diodes connected in series with an anode of a first diode of said chain of diodes supplied with a relatively high level supply of voltage and a cathode of a last diode of said chain of diodes is connected to an output of the voltage mirror.

8. An intermediary circuit formed between a relatively low voltage integrated logic circuit, having an output, and a relatively high voltage output stage having an input and an output for controlling at least one of a transducer, a plasma screen and an electromechanical actuator, said high voltage output stage comprising a CMOS device with a N type channel transistor and a P type channel transistor which are both coupled to said output of said high voltage output stage, wherein said N type channel transistor and said P type channel transistor have equal threshold voltage values, said intermediary circuit comprises a CMOS translator device coupled between the output of said low voltage integrated logic circuit and the input of said high voltage output stage, said translator device comprises at least two identical integrated circuit elements which are interconnected with one another in cross-configuration to form voltage mirrors, and said translator device further comprises a logic unit which prevents said transistors from being simultaneously conductive at the output stage.

9. An intermediary circuit according to claim 1 further comprising an auxiliary protective circuit, said auxiliary protective circuit protects at least one of said at least two identical integrated circuit elements of said voltage mirror from voltage surges, said auxiliary protective circuit includes a Zener diode with a cathode and an anode and cathode is supplied with voltage and said anode is connected to an output of the voltage mirror.

* * * * *